(12) United States Patent
Barzen et al.

(10) Patent No.: US 7,001,828 B2
(45) Date of Patent: Feb. 21, 2006

(54) METHOD AND APPARATUS FOR MANUFACTURING A DEVICE HAVING A MOVEABLE STRUCTURE

(75) Inventors: Stefan Barzen, Munich (DE); Alfons Dehe, Neufahrn (DE)

(73) Assignee: Infineon Technologies AG, Munich (DE)

( * ) Notice: Subject to any disclaimer, the term of this patent is extended or adjusted under 35 U.S.C. 154(b) by 34 days.

(21) Appl. No.: 10/872,124

(22) Filed: Jun. 18, 2004

(65) Prior Publication Data

US 2005/0026313 A1    Feb. 3, 2005

Related U.S. Application Data

(63) Continuation of application No. PCT/EP02/14193, filed on Dec. 12, 2002.

(30) Foreign Application Priority Data

Dec. 21, 2001  (DE) ................. 101 63 506

(51) Int. Cl.
*H01L 21/301* (2006.01)
(52) U.S. Cl. ..................... 438/465
(58) Field of Classification Search ............ 438/460, 438/462, 464, 435
See application file for complete search history.

(56) References Cited

U.S. PATENT DOCUMENTS

| | | |
|---|---|---|
| 5,130,276 A | 7/1992 | Adams et al. |
| 5,331,454 A | 7/1994 | Hornbeck |
| 5,389,182 A | 2/1995 | Mignardi |
| 5,393,706 A | 2/1995 | Mignardi et al. |
| 5,597,767 A | 1/1997 | Mignardi et al. |
| 5,817,539 A | 10/1998 | Werner |
| 5,824,177 A | 10/1998 | Yoshihara et al. |
| 6,106,735 A | 8/2000 | Kurle et al. |
| 2001/0029060 A1 | 10/2001 | Fukada et al. |
| 2002/0076848 A1 | 6/2002 | Spooner et al. |

FOREIGN PATENT DOCUMENTS

| | | |
|---|---|---|
| DE | 196 00 399 C1 | 8/1997 |
| DE | WO 03/053844 A1 * | 7/2003 |
| JP | 07176511 | 7/1995 |

OTHER PUBLICATIONS

Kobayashi, D., et al., "Photoresist-Assisted Release of Movable Microstructures," *Jpn. J. Appl. Phys.* vol. 32 (1993), pp. L1642-L1644, Part 2, No. 11A, Nov. 1, 1993.

* cited by examiner

*Primary Examiner*—Matthew Smith
*Assistant Examiner*—Nicholas Tobergte
(74) *Attorney, Agent, or Firm*—Slater & Matsil, L.L.P.

(57) ABSTRACT

In a method for manufacturing a device having a moveable structure a substrate is processed in order to obtain intermediate devices on the substrate, wherein an intermediate device comprises the moveable structure and a protective structure protecting the moveable structure. The substrate is diced in order to obtain a diced intermediate device comprising the protective structure. Subsequently, the protective structure is removed from the diced intermediate device in order to obtain the device. An apparatus for manufacturing a device includes means for performing the method steps.

11 Claims, 1 Drawing Sheet

METHOD AND APPARATUS FOR MANUFACTURING A DEVICE HAVING A MOVEABLE STRUCTURE

CROSS-REFERENCE TO RELATED APPLICATIONS

This application is a continuation of co-pending International Application No. PCT/EP02/14193, filed Dec. 12, 2002, which designated the United States and was not published in English, which is based on German Application No. 101 63 506.0, filed Dec. 21, 2001.

BACKGROUND OF THE INVENTION

1. Field of the Invention

The present invention relates to a method and an apparatus for manufacturing a device having a moveable structure, and in particular a micro-mechanical device.

2. Description of the Related Art

Numerous devices, in particular micromechanical devices, comprise movable structures or structures sensible for mechanical load or deformation. Among those are micro-mechanical actuators and sensors having membranes, freely vibrating springs, structures suspended on springs etc. One example for a micro-mechanical sensor is an Si microphone. These devices are generally at first manufactured with a protective structure, for example a sacrificial layer or a varnish plug, which carries the movable structure during the manufacturing process or supports the same, respectively, and thus prevents a mechanical deformation or damage of the movable structure.

During the manufacturing of a micro-mechanical device large mechanical forces may act on the same and on the moveable structure, which may for example be caused by a holding tool, a static or dynamic fluid pressure or a surface tension at a phase interface between a liquid and a gaseous medium. In the intermediate device, i.e. the uncompleted device, the protective structure absorbs these forces and thus prevents an excessive load or deformation, respectively, of the moveable structure which may otherwise lead to a tearing or breaking of the moveable structure. After a completed structuring of the intermediate device using the protective structure, the same is removed or resolved from the same, respectively, in order to release the removable structure and thus obtain the completed device. The resolving of the protective structure is usually performed in a wet-chemical process. After releasing the protective structure the moveable parts of the device are very sensitive, for example, against fluid streams or against a short-term drying when converting from a liquid medium into another.

Finally, the device has to be dried, wherein the problem occurs that with a simple drying process, at the interface between a liquid medium and a gaseous medium a surface tensions occurs which may exert great forces on the moveable structure and for example cause an adhesion of the micro-mechanical or moveable structure, respectively, to fixed areas of the device. The occurrence of an interface between a liquid and a gaseous phase may for example be prevented using the "Super Critical Point Drying", wherein by applying a pressure which is higher than the critical pressure of the substance to be removed and a temperature which is higher than the critical temperature of the substance to be removed, the substance to be removed is transferred from the liquid into the gaseous state by preventing a phase boundary from liquid to gaseous. Finally, the devices are diced and set up within casings.

The handling of the devices with the freed micro-mechanical or moveable structures, respectively, in the above-described method is problematic, as the moveable structure must not become wet anymore and must not be exposed to greater mechanical loads in any other way. Exactly this is, however, what generally happens when dicing the devices from a substrate or wafer, respectively, by sawing. From this, a great risk of damaging devices results. This problem is new, for example for Si microphones, and has not been solved up to now.

US 2001/0029060 A1 describes a manufacturing method for an acceleration sensor. The acceleration sensors processed on a substrate are here separated from each other in an intermediate state. In this intermediate state moveable parts of the acceleration sensor are protected from damage by a protective layer. After the separation process, the sensors are arranged in an chip tray. The further etching processes required for completing the sensors are performed while the sensors are present within the chip tray.

JP 7176511 A describes a chip tray in the form of a two-piece device holding means having approximately conical through-holes in which devices may be held which are simultaneously blown at by air nozzles and thereby dried.

SUMMARY OF THE INVENTION

It is the object of the present invention to provide an improved and in particular more reliable method and a more reliable apparatus for manufacturing a device having a moveable structure.

Preferred implementations of the present invention are defined in the subclaims.

In accordance with a first aspect, the present invention provides a method for manufacturing a device having a moveable structure, with the steps of processing a substrate to obtain intermediate devices on the substrate, wherein an intermediate device has the moveable structure and a protective structure protecting the moveable structure; dicing the substrate in order to obtain a diced intermediate device with the protective structure; introducing the diced intermediate device into a compartment of a plurality compartments of a device holder, wherein each compartment of the plurality of compartments includes a recess in the device holder and is implemented so that it enables a fluid communication between the recess and an environment of the device holder; and removing the protective structure from the diced intermediate device while the diced intermediate device is held in the device holder, by feeding a fluid from the environment of the device holder to the diced intermediate device in the device holder in order to obtain the device; and testing the device comprising the moveable structure, while the device is held within the device holder.

In accordance with a second aspect, the present invention provides an apparatus for manufacturing a device having a moveable structure, having a processor for processing a substrate which is implemented in order to generate an intermediate device having the moveable structure and a protective structure protecting the moveable structure on the substrate; a dicer for dicing the substrate which is implemented in order to obtain a diced intermediate device comprising the protective structure; a remover for removing the protective structure from the diced intermediate device which is implemented in order to obtain the device; and a device holder for holding the diced intermediate device within the remover for removing, wherein the device holder comprises a plurality of compartments for accepting intermediate devices and wherein each compartment of the plurality of compartments includes a recess and is implemented so that it enables a fluid communication between the recess and an environment of the device holder, wherein the remover for removing is implemented in order to remove the protective structure by supplying a fluid from the environment of the device holder to the diced intermediate device within the device holder; and a tester for testing the device which is implemented in order to test the device held within the device holder.

The present invention is based on the finding that a manufacturing process, in which a moveable structure of a device is only released in the last manufacturing step by removing a protective structure, is more reliable, as the protective structure may thus protect the moveable structure to the end. Thereby, the use of a device holding means and in particular a chip tray is preferred. A chip tray is a container for a plurality of chips or devices, respectively, or intermediate devices, comprising a corresponding plurality of compartments for one intermediate device each within the bottom part. The compartments may be closed using a lid so that intermediate devices are held fixed within the compartments and are secured against falling out. Bottom part and/or lid comprise openings through which a liquid or a gas, which surrounds the chip tray, may enter within the same and reach the devices within the compartments.

The method for manufacturing a device having a moveable structure provides to dice intermediate devices even before a removal of sacrificial layers or protective structures, respectively, by sawing. Subsequently, the intermediate devices are put into the chip tray. The intermediate devices are accessible for liquids or gasses through the mentioned openings of the chip tray. The chip tray consists of a material which is resistant against the following chemical processes and provides an electrostatic charging. Chip trays having these characteristics are for example available from the company of Entegris. The equipped chip tray then runs through wet-chemical steps for removing the protective structure or sacrificial layer, respectively, and, if applicable, through varnish dissolving steps, cleaning steps and drying steps, for example a Super Critical Point Drying. At that, several chip trays may be summarized according to a horde principle, so that the complete staple may be processed simultaneously.

After the described steps of removing the protective structure, cleaning and drying, the completed sensitive devices lie protected within the chip tray and are removed from the same for arranging, inserting into the housing, etc. Before removing the devices the same may also be subjected to a test with regard to their functioning still within the chip tray.

One advantage of the present invention is that a device having a moveable structure is protected during the critical process step of dicing.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
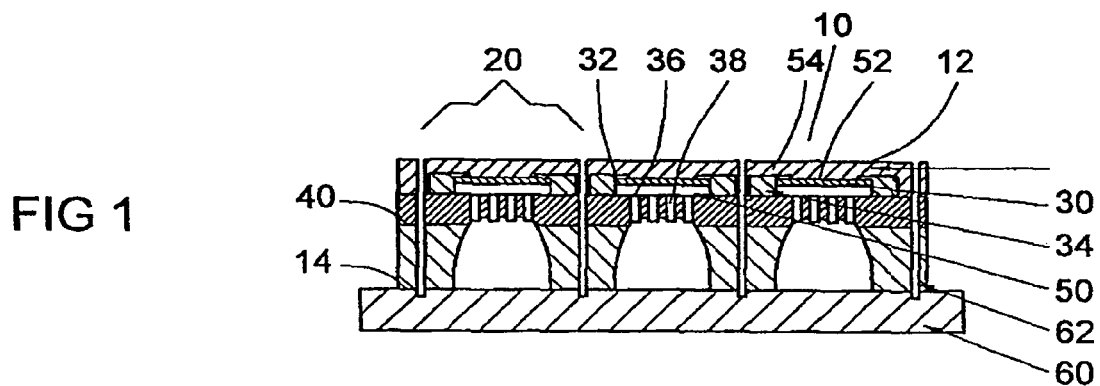
FIG. 1 shows a schematical sectional illustration of a wafer having several intermediate devices.

FIG. 1 is a schematical illustration of a vertical section through a substrate or a wafer 10, respectively, i.e. of a section perpendicular to a first surface 12 and a second surface 14 of the wafer 10. The wafer 10 is processed in several method steps in order to obtain intermediate devices 20 on or in the wafer 10, respectively. The devices 20 are Si microphones in the illustrated example, wherein each intermediate device 20 comprises a membrane 30 held at its edge 32 by a membrane support 34 and comprising a counter electrode 36 having several openings 38. The membrane support 34 is connected to the counter electrode 36, so that membrane and counter electrode oppose each other in parallel and spaced apart from each other. The counter electrode 36 is further connected to a frame 42 with its surface 40 facing away from the membrane 30. Between the membrane 30 and the counter electrode 36 and within the openings 38 of the counter electrode a sacrificial layer or protective structure 50, respectively, is arranged. The surface 52 of the membrane 30 facing away from the counter electrode 36 is covered by a varnish layer 54 which substantially extends across all devices 20.

The wafer 10 or the intermediate devices 20, respectively, are applied to a saw foil 60 with the frames 42 and thus prepared to a dicing step. The wafer 10 is sawed along the sawing traces 62, whereby the intermediate devices 20 are separated from each other and are only connected via the sawing foil 60.

Figure 2:
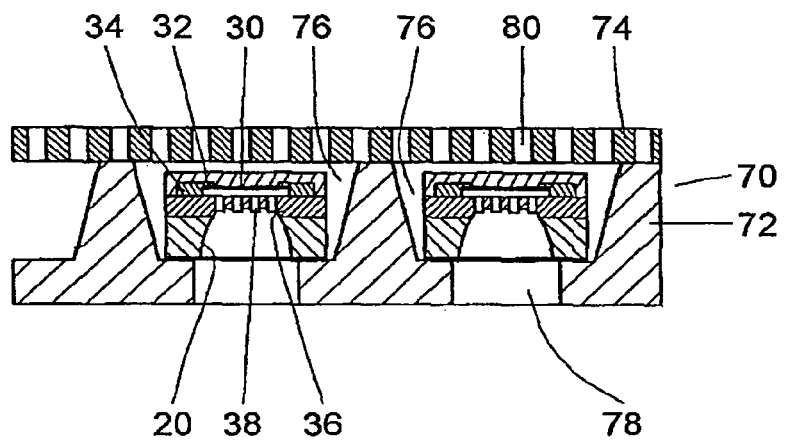
FIG. 2 shows a schematical sectional illustration of a chip tray having several diced intermediate devices.

After dicing, the intermediate devices-20 are separated from the sawing foil 60 and inserted into a device holding means or a chip tray 70, respectively, as it is illustrated in FIG. 2. The chip tray 70 includes a bottom part 72 and a lid 74. Within the bottom part 72 compartments 76 are arranged, wherein each compartment 76 is provided to accept a diced intermediate device 20. The lid 74 closes the compartments 76 of the bottom part 72 so that intermediate devices 20 contained within the same are secured against falling out. Both, the bottom part 72 and the lid 74 respectively comprise a number of openings 78, 80 through which an intermediate device 20 within a compartment 76 is in fluid communication with the environment of the chip tray 70.

After introducing the intermediate devices 20 into the compartments 76 of the chip tray 70 and the closing of the compartments 76 using the lid 74, the protective structure 50 is wet-chemically removed. For this, the complete chip tray 70 is immersed into an etching bath, which is selected so that it neither reacts chemically with the membrane 30, the membrane support 34, the counter electrode 36 nor the frame 42, but only dissolves the protective structure 50. The etching medium enters into the compartments 76 of the chip tray 70 through the openings 78 in the bottom part 72 and the openings 80 in the lid 74 and there influences the intermediate devices 20 in a desired way.

Figure 3:
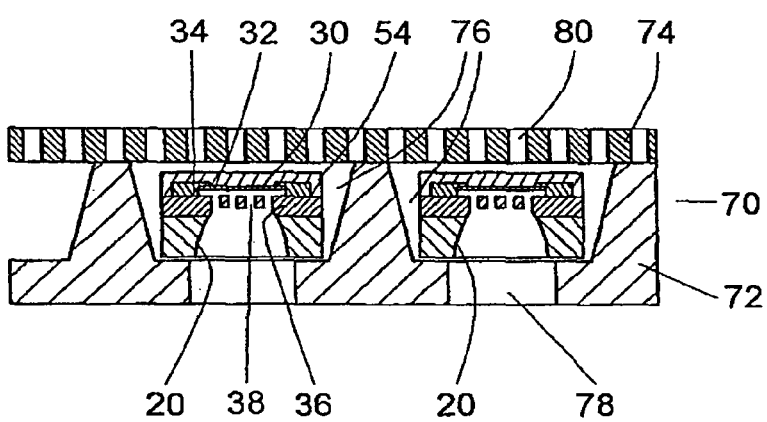
FIG. 3 shows a schematical illustration of the chip tray with the diced intermediate devices after removing a protective structure.

The state obtained as a result of the influence of the etching medium on the intermediate device 20 is illustrated in FIG. 3. In the illustrated embodiment, the material of the varnish layer 54 and the etching medium is selected so that the etching medium does not 54 at all or not substantially remove the varnish layer. This is for example the case when the etching medium is an anorganic acid or base and the protective structure comprises silicon oxide, aluminum or another anorganic material, wherein the varnish layer comprises an organic material. As mentioned above, the intermediate device is very fragile after removing the protective structure. The chip tray may reduce occurring forces caused by a fluid and may prevent a drying of the structures when they are transferred into another medium.

Figure 4:
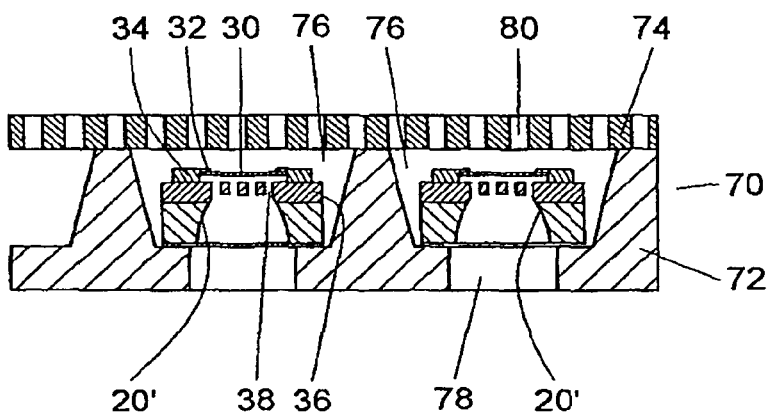
FIG. 4 shows a schematical sectional illustration of the chip tray with devices obtained from the intermediate devices.

In a further method step, the chip tray 70 with the intermediate devices 20 is subjected to a medium removing the varnish layer 54, for example to an organic solvent. The devices 20', as illustrated in FIG. 4, are obtained with an exposed membrane 30 on both sides.

In the following method steps, the devices 20' have to be dried, for example using $CO_2$ Super Critical Point Drying (CPD), using self assembling monolayers (SAM) or using freeze-drying. By these methods it is prevented that the membrane 30 is drawn to the counter electrode 36 and thereby damaged and/or adheres to the same due to the surface tension of an interface occurring during drying between a liquid and a gaseous phase.

The manufactured devices 20' may be subjected to a test with regard to their functioning still within the chip tray 70. For this, either the lid 74 is removed or the same comprises openings through which probes may be moved towards the devices 20' using which electrical, optical or acoustic signals are transmitted to the devices 20' or may be received from the same.

Finally, the devices 20' are individually removed from the compartments 76 of the chip tray 70 and are electrically contacted, provided with housings, or applied to other devices.

The present invention is not only applicable to the illustrated Si microphones 20' in the embodiment, but to all devices comprising mechanically sensitive, in particular moveable structures. Apart from the membrane 30 of the embodiment, also all kinds of springs and elastic elements and structures suspended at the same are moveable structures sensitive against mechanical load. Thus, in particular micromechanical sensors and actuators for detecting or generating, respectively, of linear and/or rotatory accelerations or forces, or movements, respectively, count among devices 20', whose manufacturing is simplified or made more reliable, respectively, by the inventive method and the inventive apparatus.

Using the present invention, any devices may advantageously be produced comprising structures which, however, need not be moveable due to the functionality of the device, which, however, are filigree due to other requirements and therefore actually also moveable and sensitive against mechanical loads.

Further, the wafer 10 may, in deviation of the embodiment illustrated in the figure, comprise different devices and in particular apart from one or several similar or different devices with moveable structures also further devices without moveable structures, like e.g. circuits. Accordingly, in the inventive method or the inventive apparatus, respectively, apart from a device with a moveable structure further similar or different devices with or without moveable structures may be arranged within the chip tray 70.

Additionally, the intermediate devices may be diced using another method but sawing, for example using a laser beam, by etching or breaking.

For removing the protective structure 50, which may for example comprise silicon oxide, aluminum or an organic varnish, apart from the described wet-chemical method also other known material removing methods may be used, for example reactive ion etching, the use of a plasma, etching in the gas phase, etc.

Further, an intermediate device 20 may comprise several protective structures instead of one, which may consist of different materials. In this regard, also the varnish layer 54 of the illustrated-embodiment may be regarded as a protective structure for the membrane 30.

Adapting to the devices 20' or the intermediate devices 20, respectively, and to used processing steps and processing equipment, the form and setup of the chip tray 70 may deviate from the embodiment illustrated in the figures. For example, the compartments 76 may be arranged within the lid 74 instead of the bottom parts, or both the bottom part 72 and the lid 74 may comprise corresponding recesses for accepting intermediate devices. Further, instead of the chip tray 70 any desired device holding means may be used which is suitable to securely hold the intermediate devices 20 or the devices 20', respectively, and simultaneously enables the access of an etching medium to the intermediate devices 20.

In the inventive manufacturing process, apart from the use of a chip tray or another device holding means, individual method parts, for example the dicing process and the setup process, may be used by standard lines for microelectronic devices.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for manufacturing a device having a moveable structure, comprising:

processing a substrate to obtain intermediate devices on the substrate, wherein an intermediate device comprises the moveable structure and a protective structure protecting the moveable structure;

dicing the substrate in order to obtain a diced intermediate device comprising the protective structure;

introducing the diced intermediate device into a compartment of a plurality compartments of a device holder, wherein each compartment of the plurality of compartments includes a recess in the device holder and is implemented so that it enables a fluid communication between the recess and an environment of the device holder; and removing the protective structure from the diced intermediate device while the diced intermediate device is held in the device holder, by feeding a fluid from the environment of the device holder to the diced intermediate device in the device holder in order to obtain the device; and testing the device comprising the moveable structure, while the device is held within the device holder.

2. The method according to claim 1, wherein the step of dicing includes a mechanical method for dicing.

3. The method according to claim 1, wherein the protective structure is wet-chemically removed from the diced intermediate device by plasma etching, ion etching or etching in the vapor phase.

4. The method according to claim 1, wherein the device is a micro-mechanical device.

5. The method according to claim 1, wherein the protective structure includes a sacrificial layer or a varnish plug.

6. The method according to claim 1, further comprising a step of super critical point drying or a step of drying using a self assembling monolayer or a step of freeze-drying.

7. An apparatus for manufacturing a device having a moveable structure, comprising:
- a processor for processing a substrate which is implemented in order to generate an intermediate device comprising the moveable structure and a protective structure protecting the moveable structure on the substrate;
- a dicer for dicing the substrate which is implemented in order to obtain a diced intermediate device comprising the protective structure;
- a remover for removing the protective structure from the diced intermediate device which is implemented in order to obtain the device; and
- a device holder for holding the diced intermediate device within the remover for removing, wherein the device holder comprises a plurality of compartments for accepting intermediate devices and wherein each compartment of the plurality of compartments includes a recess and is implemented so that it enables a fluid communication between the recess and an environment of the device holder,
wherein the remover for removing is implemented in order to remove the protective structure by supplying a fluid from the environment of the device holder to the diced intermediate device within the device holder; and
- a tester for testing the device which is implemented in order to test the device held within the device holder.

8. The device according to claim 7, wherein the dicer dicing includes a dicer for mechanically dicing.

9. The apparatus according to claim 7, wherein the device holder comprises a bottom part with the plurality of compartments and a lid, wherein the plurality of compartments is closeable by the lid in order to hold the diced intermediate devices in the plurality of compartments, wherein the bottom part and/or the lid comprises an opening in order to facilitate the fluid communication between the diced intermediate device and the environment of the device holder.

10. The apparatus according to claim 7, wherein the protective structure includes a sacrificial layer or a varnish plug.

11. The apparatus according to claim 7, further comprising a drier for super critical point drying or drying using a self assembling monolayer or for freeze-drying.

* * * * *